United States Patent
Fujii et al.

(10) Patent No.: US 10,191,078 B2
(45) Date of Patent: Jan. 29, 2019

(54) ACCELERATION SENSOR

(71) Applicant: Panasonic Intellectual Property Management Co., Ltd., Osaka (JP)

(72) Inventors: Atsuhiro Fujii, Fukui (JP); Takashi Imanaka, Osaka (JP); Yuichi Miyoshi, Osaka (JP); Hiroyuki Aizawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 219 days.

(21) Appl. No.: 15/156,329

(22) Filed: May 17, 2016

(65) Prior Publication Data

US 2016/0258975 A1    Sep. 8, 2016

Related U.S. Application Data

(63) Continuation of application No. PCT/JP2015/000312, filed on Jan. 26, 2015.

(30) Foreign Application Priority Data

Jan. 27, 2014   (JP) ................................ 2014-012037

(51) Int. Cl.
*G01P 15/12* (2006.01)
*G01P 15/08* (2006.01)
*G01P 21/00* (2006.01)

(52) U.S. Cl.
CPC .......... *G01P 15/0802* (2013.01); *G01P 15/12* (2013.01); *G01P 21/00* (2013.01);
(Continued)

(58) Field of Classification Search
None
See application file for complete search history.

(56) References Cited

U.S. PATENT DOCUMENTS

| | | | | |
|---|---|---|---|---|
| 5,554,875 A | * | 9/1996 | Hartauer | B81C 1/00246 257/417 |
| 2004/0016981 A1 | * | 1/2004 | Yoshida | G01P 15/0802 257/414 |

(Continued)

FOREIGN PATENT DOCUMENTS

| | | |
|---|---|---|
| JP | 5-273231 | 10/1993 |
| JP | 6-148230 | 5/1994 |

(Continued)

OTHER PUBLICATIONS

International Search Report of PCT application No. PCT/JP2015/000312 dated Mar. 31, 2015.

*Primary Examiner* — Paul West
*Assistant Examiner* — Mark A Shabman
(74) *Attorney, Agent, or Firm* — McDermott Will & Emery LLP (57) ABSTRACT

An acceleration sensor includes a detection device, an opposed electrode, and a top lid. The detection device includes an active layer, a base layer, an oxide layer disposed between the active layer and the base layer, a first insulating layer, a contact portion, and a self-check electrode. The first insulating layer is disposed on the active layer at a side opposite to the oxide layer and provided with a first opening. The contact portion is disposed on a part of the first insulating layer at a side opposite to the active layer and includes a first metal layer connected to the active layer through the first opening. The opposed electrode is disposed at a location opposing the self-check electrode, and the top lid supports the opposed electrode.

7 Claims, 10 Drawing Sheets

(52) U.S. Cl.
CPC ............. *B81B 2203/0118* (2013.01); *G01P 2015/0828* (2013.01)

(56) References Cited

U.S. PATENT DOCUMENTS

| | | | | |
|---|---|---|---|---|
| 2004/0123664 | A1* | 7/2004 | Ohtoyo ................. | B81B 3/0072 73/514.33 |
| 2009/0126490 | A1* | 5/2009 | Sameshima ............ | G01C 19/56 73/514.32 |
| 2009/0152656 | A1* | 6/2009 | Okudo ................ | B81C 1/00269 257/419 |
| 2009/0305439 | A1* | 12/2009 | Morii ................. | G01C 19/5719 438/8 |
| 2010/0186510 | A1 | 7/2010 | Robert | |

FOREIGN PATENT DOCUMENTS

| | | |
|---|---|---|
| JP | 10-300772 | 11/1998 |
| JP | 2005-127890 | 5/2005 |
| JP | 2010-169685 | 8/2010 |
| JP | 2012-008023 | 1/2012 |

\* cited by examiner

ACCELERATION SENSOR

BACKGROUND

1. Technical Field

The present technical field relates to acceleration sensors for use in, for example, vehicles.

2. Background Art

Figure 12:
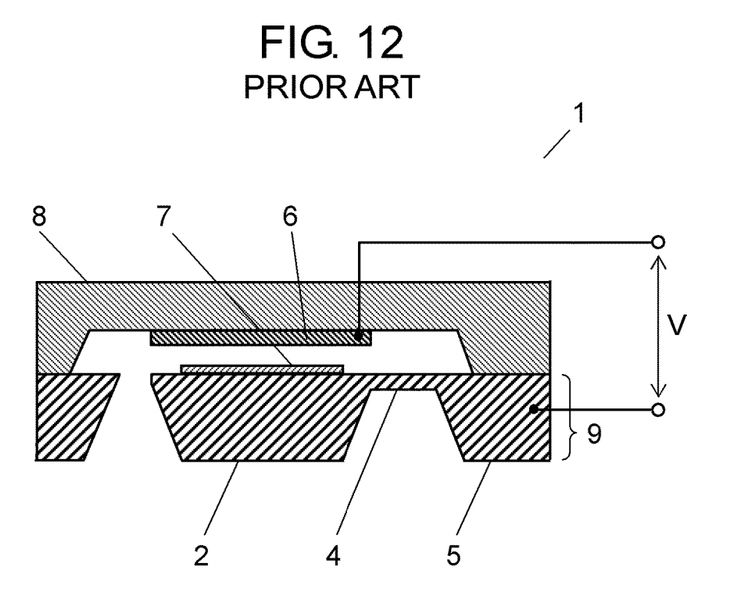
FIG. 12 is a cross-sectional view of a conventional acceleration sensor.

FIG. 12 is a cross-sectional view of conventional acceleration sensor 1. Acceleration sensor 1 includes weight part 2, outer frame 5, strain part 4, upper substrate 8, self-check electrode 7, and opposed electrode 6. Strain part 4 has a first end connected to weight part 2 and a second end connected to outer frame 5. Upper substrate 8 is connected to outer frame 5 so as to face weight part 2. Self-check electrode 7 is formed on the upper surface of weight part 2. Opposed electrode 6 is disposed on upper substrate 8 at a location facing self-check electrode 7.

In this configuration, when a voltage is applied across self-check electrode 7 and opposed electrode 6 so as to apply an electrostatic voltage V to weight part 2, weight part 2 operates as if acceleration is applied to weight part 2. Based on this operation, it can be self-checked whether acceleration sensor 1 normally operates or not.

SUMMARY

An acceleration sensor according to the present disclosure includes a detection device, an opposed electrode, and a top lid. The detection device includes an active layer, a base layer, an oxide layer disposed between the active layer and the base layer, a first insulating layer, a contact portion, and a self-check electrode. The first insulating layer is disposed on the active layer at a side opposite to the oxide layer and provided with a first opening. The contact portion is disposed on a part of the first insulating layer at a side opposite to the active layer and includes a first metal layer connected to the active layer through the first opening. The opposed electrode is disposed at a location opposing the self-check electrode, and the top lid supports the opposed electrode.

A sensor according to the present disclosure includes a contact portion grounding the active layer. Thus, charging of the weight part can be suppressed. As a result, an electrostatic force that causes the weight part to operate is stabilized so that self-check can be normally performed.

DETAILED DESCRIPTION OF PREFERRED EMBODIMENTS

Prior to description of the present disclosure, problems in conventional acceleration sensor 1 illustrated in FIG. 12 will be described. Upon application of a voltage across self-check electrode 7 and opposed electrode 6, weight part 2, which is in a floating state, is electrically charged. When weight part 2 is electrically charged in this manner, an electrostatic force varies. This variation affects an operation of weight part 2. Accordingly, an output of a self-check function varies and, as a result, a failure in weight part 2 might not be detected accurately.

Acceleration sensors according to embodiments of the present disclosure will be described hereinafter with reference to the drawings.

First Exemplary Embodiment

Figure 1:
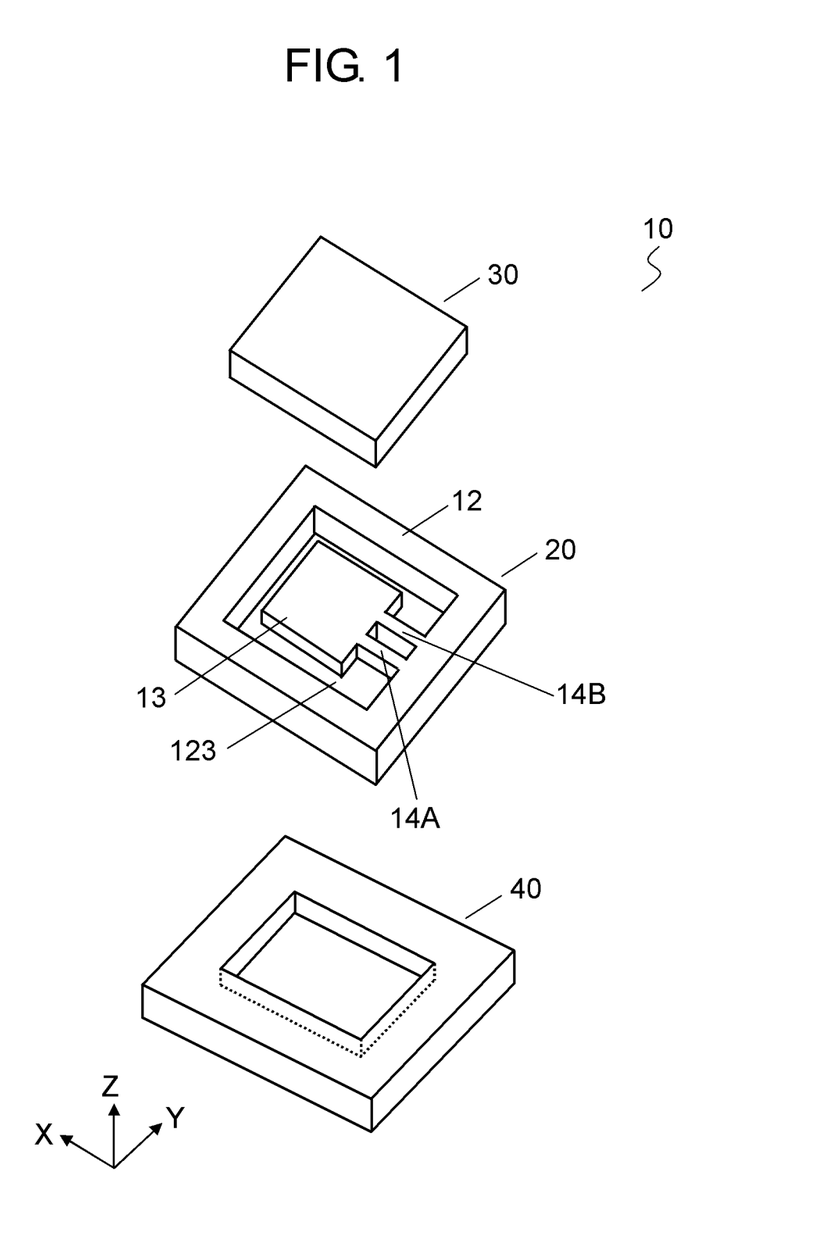
FIG. 1 is an exploded perspective view of an acceleration sensor according to a first embodiment of the present disclosure.
Figure 2:
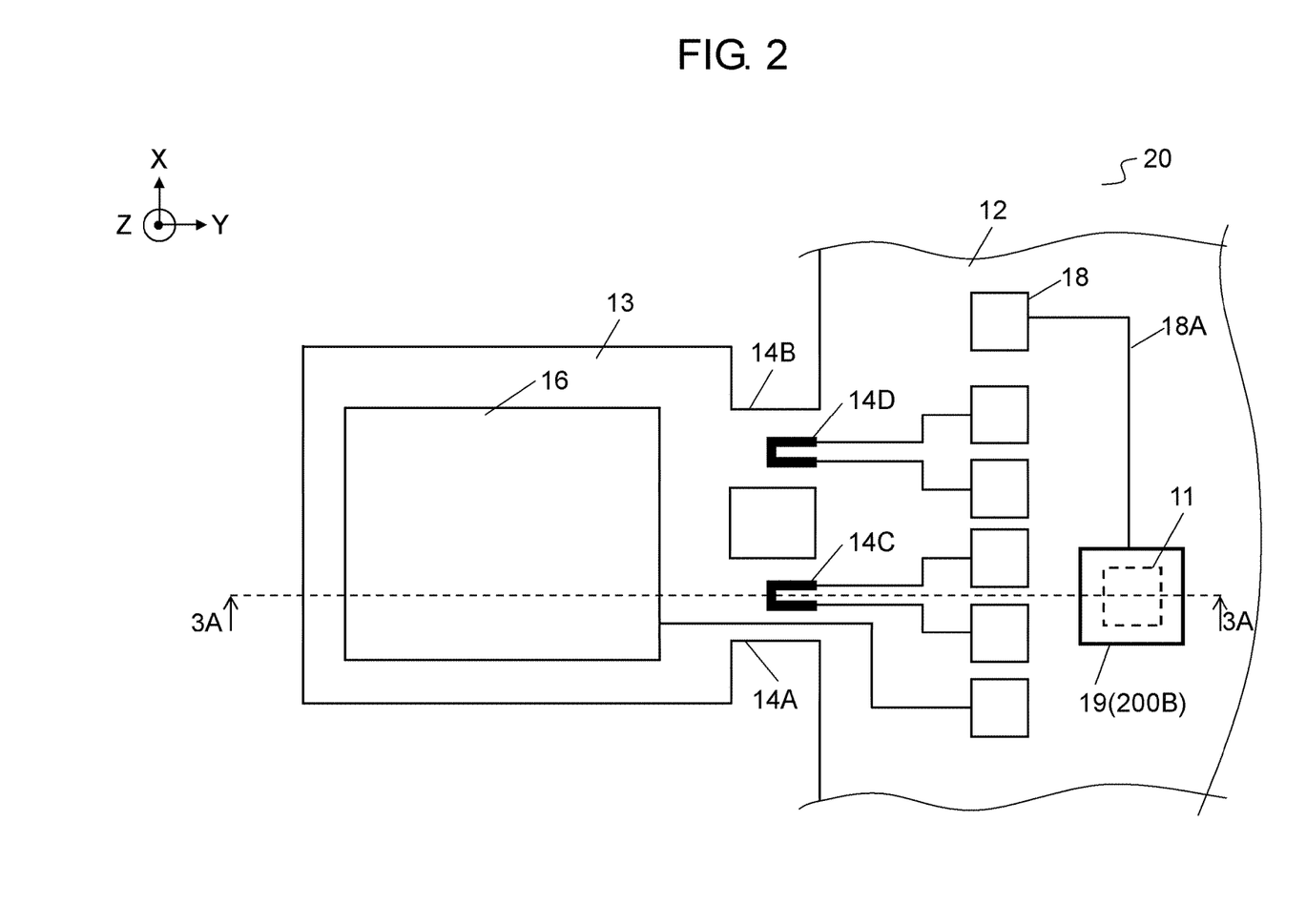
FIG. 2 is a partial top view of a detection device illustrated in FIG. 1.
Figure 3A:
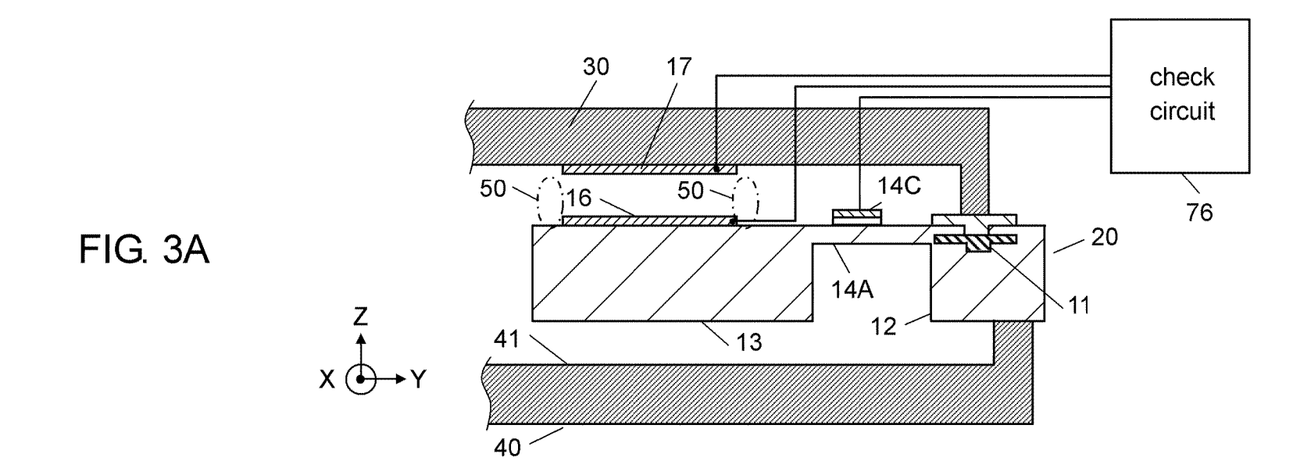
FIG. 3A is a partial cross-sectional view of the acceleration sensor illustrated in FIG. 1.
Figure 3B:
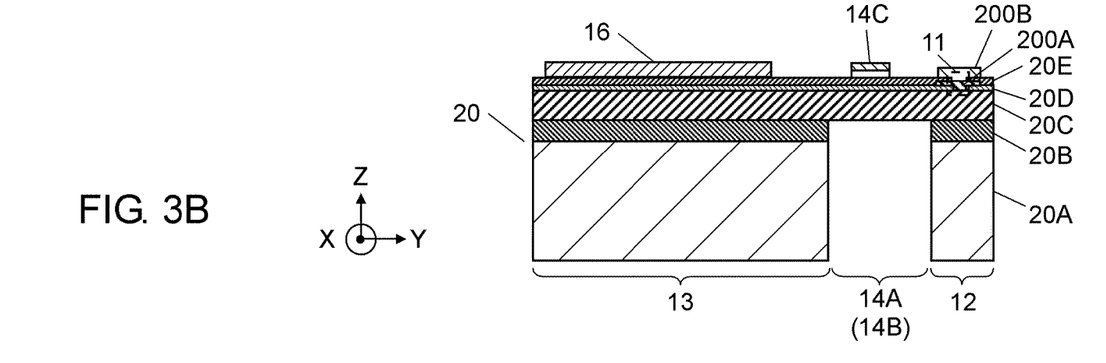
FIG. 3B is a cross-sectional view of the detection device illustrated in FIG. 1.

FIG. 1 is an exploded perspective view of acceleration sensor 10 according to a first embodiment of the present disclosure. FIG. 2 is a partial top view of detection device 20. FIG. 3A is a cross-sectional view taken along line 3A-3A in FIG. 2. FIG. 3B is a cross-sectional view of detection device 20 illustrated in FIG. 3A.

As illustrated in FIG. 1, acceleration sensor 10 includes detection device 20, top lid 30, and bottom lid 40. Top lid 30 is connected to an upper surface (a first surface) of detection device 20. Bottom lid 40 is connected to a lower surface (a second surface) of detection device 20. That is, detection device 20 is held between top lid 30 and bottom lid 40.

As illustrated in FIGS. 1 and 2, detection device 20 includes frame 12, weight part 13, first beam 14A and second beam 14B, self-check electrode 16, and ground electrode 18. Each of first beam 14A and second beam 14B has a first end connected to weight part 13 and second end connected to frame 12. Self-check electrode 16 is formed on an upper surface of weight part 13, and ground electrode 18 is formed on frame 12.

Frame 12 is located at an outer periphery of detection device 20, and has an approximately quadrangular frame shape, for example. Frame 12 surrounds weight part 13. First beam 14A and second beam 14B are disposed inside frame 12. The configuration illustrated in FIGS. 1 and 2 includes first beam 14A and second beam 14B. However, the present disclosure is not limited to this configuration. For example, weight part 13 may be supported by one or three beams.

Detection portion 14C is formed on first beam 14A, and detection portion 14D is formed on second beam 14B. As detection portions 14C and 14D, a strain resistance can be used. Employing a piezoresistance as the strain resistance can enhance the sensitivity of acceleration sensor 10. Employing a thin film resistance including an oxide film strain resistor as the strain resistance can enhance temperature characteristics of acceleration sensor 10.

Weight part 13 is coupled to the tips (first ends) of first beam 14A and second beam 14B, and is disposed inside frame 12. Through slot 123 is provided between weight part 13 and frame 12 and surrounds weight part 13. In this manner, a clearance is formed between weight part 13 and frame 12, and weight part 13 is supported by first beam 14A and second beam 14B so that weight part 13 can be displaced in a Z-axis direction.

As illustrated in FIG. 3B, detection device 20 includes base layer 20A, oxide layer 20B, active layer 20C, first insulating layer 20D, contact portion 11, and self-check electrode 16. Detection device 20 further includes second insulating layer 20E on first insulating layer 20D. Base layer 20A is made of silicon. Oxide layer 20B is an insulating layer of a silicon oxide film formed on base layer 20A. Active layer 20C is a silicon layer formed on oxide layer 20B. That is, oxide layer 20B is disposed between active layer 20C and base layer 20A. First insulating layer 20D is disposed on active layer 20C. That is, first insulating layer 20D is disposed on active layer 20C at a side opposite to base layer 20B. Contact portion 11 will be described later. Self-check electrode 16 is formed on second insulating layer 20E in weight part 13, and as illustrated in FIG. 2, is connected to an electrode pad on frame 12 by way of a wire on first beam 14A or second beam 14B.

Frame 12 includes a part of first insulating layer 20D, a part of active layer 20C, a part of oxide layer 20B, and a part of base layer 20A. Frame 12 further includes a part of second insulating layer 20E. Each of first beam 14A and second beam 14B includes a part of first insulating layer 20D and a part of active layer 20C, and also has a first end and a second end which is connected to frame 12. First beam 14A and second beam 14B also include parts of second insulating layer 20E, respectively. Weight part 13 includes a part of first insulating layer 20D, a part of active layer 20C, a part of oxide layer 20B, and a part of base layer 20A, and is connected to the first ends of first beam 14A and second beam 14B. Weight part 13 also includes a part of second insulating layer 20E.

Frame 12, weight part 13, first beam 14A, second beam 14B, top lid 30, and bottom lid 40 can be formed by using silicon, fused quartz, or alumina, for example. Preferably, by using silicon, small-size acceleration sensor 10 can be formed with a micromachining technique.

Opposed electrode 17 is formed on top lid 30 at a location opposing (or facing) self-check electrode 16. That is, opposed electrode 17 is disposed at the location facing weight part 13, and top lid 30 supports opposed electrode 17 and is connected to frame 12. Specifically, top lid 30 is joined to frame 12 in bonding region 19 illustrated in FIG. 2. As a method for the joint, bonding with an adhesive, a metal joint, a room-temperature joint, and an anode joint, for example, can be used. Examples of the adhesive include adhesives such as an epoxy resin and a silicon resin. The use of a silicon resin as the adhesive can reduce stress caused by curing of the adhesive itself.

Contact portion 11 is preferably disposed in bonding region 19. This configuration is efficient because the ground electrode on top lid 30 can be shared with contact portion 11, and thus, no new electrode needs to be formed.

Recess 41 is formed in bottom lid 40 at a portion facing weight part 13.

Figure 4:
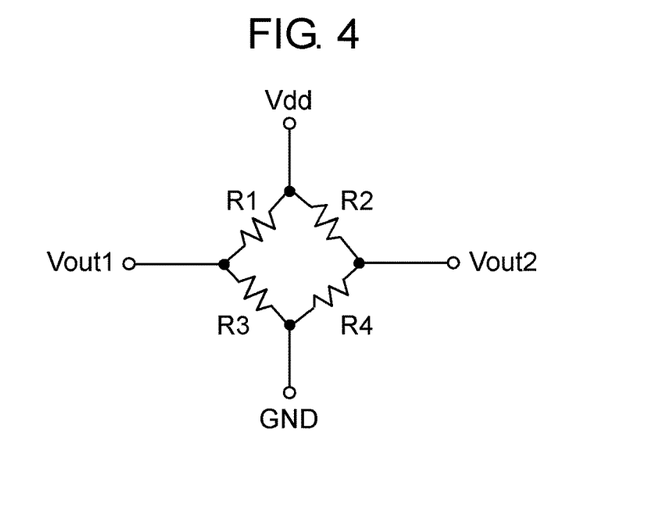
FIG. 4 is a circuit diagram of a detection circuit of the acceleration sensor illustrated in FIG. 1.

FIG. 4 is a circuit diagram illustrating a detection circuit of acceleration sensor 10. R1 denotes a resistor corresponding to detection portion 14C, R4 denotes a resistor corresponding to detection portion 14D, and R2 and R3 denote reference resistors provided on frame 12. As illustrated in FIG. 4, R1, R2, R3, and R4 are connected to each other in a bridge pattern.

In the foregoing configuration, when an acceleration is applied on acceleration sensor 10 in the Z-axis direction, an inertial force (external stress) on weight part 13 causes weight part 13 to swing, resulting in deformation by strain of first beam 14A and second beam 14B. Consequently, stress is applied to detection portions 14C and 14D. In this manner, resistance values (R1 and R4) of detection portions 14C and 14C change depending on external stress caused by acceleration. Thus, acceleration applied to acceleration sensor 10 can be detected by applying a voltage across a pair of opposed connection points Vdd and GND to detect a change in voltage between Vout1 and Vout2.

Referring now to FIGS. 3A and 4, a self-check function will be described. As illustrated in FIG. 3A, in performing self-check, check circuit 76, which is a check part, applies a voltage V across self-check electrode 16 and opposed electrode 17. The voltage application generates an electrostatic force between self-check electrode 16 and opposed electrode 17 so that weight part 13 is attracted to top lid 30. Such a displacement of weight part 13 reduces a resistance value of the resistor R1 corresponding to detection portion 14C and a resistance value of the resistor R4 corresponding to detection portion 14D. Thus, a voltage change between output voltages Vout1 and Vout2 of the bridge circuit is detected, and it is determined that the acceleration sensor normally operates.

In performing this self-check, the voltage V applied across self-check electrode 16 and opposed electrode 17 might cause active layer 20C of weight part 13 to be electrically charged so that the electrostatic force can vary. Such a variation of the electrostatic force affects the operation of weight part 13. More specifically, an electric field is also formed in a region except a region between self-check electrode 16 and opposed electrode 17, e.g., in space 50 between active layer 20C and opposed electrode 17. Consequently, an electrostatic force different from the desired electrostatic force is generated. In another case, a variation of the amount of charging of active layer 20C causes the electrostatic force to be unstable so that the self-check function varies. To prevent such a variation in the electrostatic force, contact portion 11 is provided on frame 12.

Figure 5:
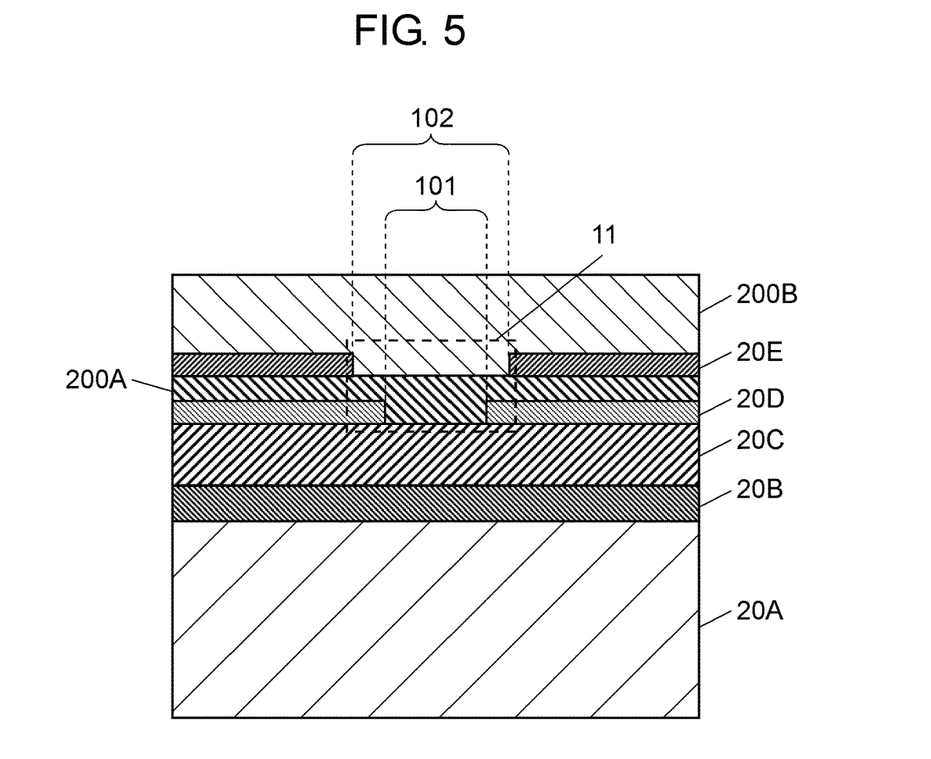
FIG. 5 is a cross-sectional view of a contact portion of the detection device illustrated in FIG. 3B.

FIG. 5 is a cross-sectional view of contact portion 11. Contact portion 11 includes first metal layer 200A, second insulating layer 20E, and second metal layer 200B. First metal layer 200A is disposed on a part of first insulating layer 20D at the side opposite to active layer 20C. Second insulating layer 20E is disposed on first metal layer 200A at the side opposite to first insulating layer 20D, and is provided with second opening 102. Second metal layer 200B is disposed on a part of second insulating layer 20E at the side opposite to first metal layer 200A, and is connected to first metal layer 200A through second opening 102.

In this configuration, first metal layer 200A is an adhesion layer made of a material that prevents interdiffusion between silicon constituting active layer 20C and a metal constituting second metal layer 200B. First metal layer 200A is made of, for example, chromium or an alloy containing chromium. That is, first metal layer 200A is made of a material capable of preventing interdiffusion between a material included in active layer 20C and a material included in second metal layer 200B. Second insulating layer 20E insulates second metal layer 200B from other layers (i.e., other electrodes and wires). Second metal layer 200B is connected to ground electrode 18 provided on frame 12 by way of wire 18A. That is, ground electrode 18 is electrically connected to active layer 20C of frame 12 through first metal layer 200A and second metal layer 200B of contact portion 11.

In this configuration, even when weight part 13 is charged in the process of self-check, the electrical charge in weight part 13 can be discharged to the ground through active layer 20C in weight part 13, active layer 20C in first beam 14A and second beam 14B, active layer 20C in contact portion 11 of frame 12, first metal layer 200A, second metal layer 200B, wire 18A, and ground electrode 18. Thus, it is possible to suppress formation of an electric field in space 50. As a result, an electrostatic force that causes weight part 13 to operate is stabilized so that self-check can be normally performed.

In contact portion 11, a center of first opening 101 in first insulating layer 20D coincides with a center of second opening 102 in second insulating layer 20E when viewed in a transparent plan view. In this transparent plan view, first opening 101 is preferably smaller than second opening 102. That is, in a vertical cross section illustrated in FIG. 5, the width of second opening 102 is larger than the width of first opening 101. This configuration can reduce a contact resistance between first metal layer 200A and second metal layer 200B and, thereby, suppressing weight part 13 from charging more efficiently. The centers of first opening 101 and second opening 102 do not need to coincide with each other in the transparent plan view. In this case, it is sufficient that first opening 101 is entirely located within second opening 102.

Next, an example of a procedure for forming contact portion 11 illustrated in FIG. 5 will be described with reference to FIGS. 6A to 6F.

Figure 6A:
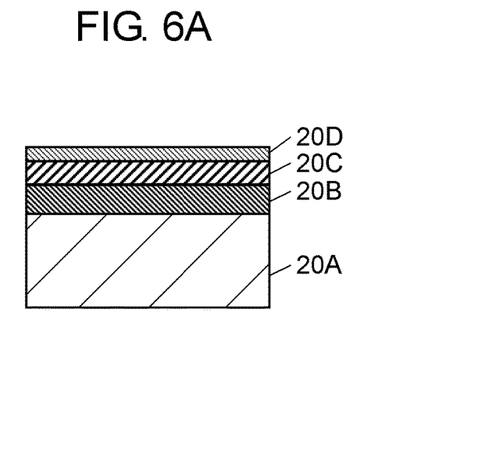
FIG. 6A is a cross-sectional view illustrating a method for fabricating a detection device including the contact portion illustrated in FIG. 5.

First, a base material including base layer 20A made of silicon, active layer 20C made of silicon, and oxide layer 20B disposed between base layer 20A and active layer 20C and made of silicon oxide is prepared. This base material is generally called a Silicon On Insulator (SOI) substrate. Then, as illustrated in FIG. 6A, first insulating layer 20D is formed on a surface of active layer 20C. First insulating layer 20D protects the surface of active layer 20C and insulates active layer 20C from the outside. In the case of forming an oxide film such as $SiO_2$ as first insulating layer 20D, for example, a surface portion of active layer 20C is oxidized by, for example, a thermal oxidation technique.

Figure 6B:
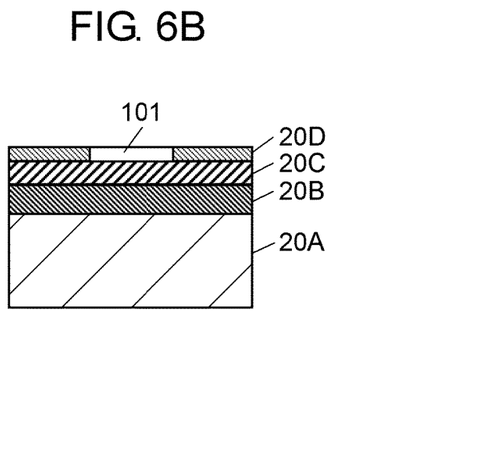
FIG. 6B is a cross-sectional view illustrating the method for fabricating the detection device subsequent to the process step illustrated in FIG. 6A.

Next, as illustrated in FIG. 6B, first opening 101 is formed at a predetermined location in first insulating layer 20D. First opening 101 can be formed by, for example, a photolithography technique. Specifically, a resist film is first formed on the entire surface of first insulating layer 20D, and then, a part of the resist film except a region where first opening 101 is to be formed is cured by ultraviolet radiation, using a mask disposed above the resist film. An uncured part of the resist film, that is, a part of the resist film corresponding to the region where first opening 101 is to be formed, is removed so that a hole is formed in the resist film to reach first insulating layer 20D. Subsequently, first insulating layer 20D is etched through the hole in the resist film. This etching may be dry etching or wet etching. In this manner, first insulating layer 20D is partially removed so that first opening 101 is formed. Thereafter, the resist film is removed by, for example, ashing. Using the photolithography technique described above, first opening 101 can be formed.

Figure 6C:
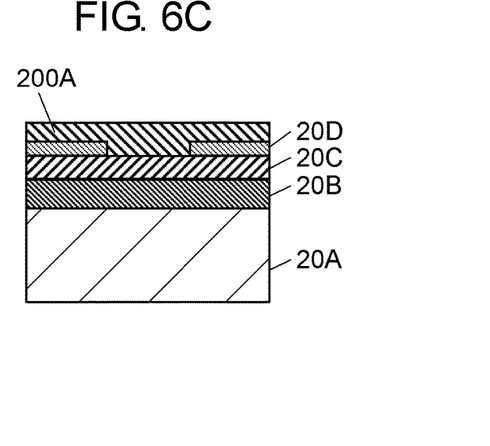
FIG. 6C is a cross-sectional view illustrating the method for fabricating the detection device subsequent to the process step illustrated in FIG. 6B.

Then, as illustrated in FIG. 6C, first metal layer 200A is formed by, for example, a deposition technique such as spattering, on the entire surface of first insulating layer 20D.

Figure 6D:
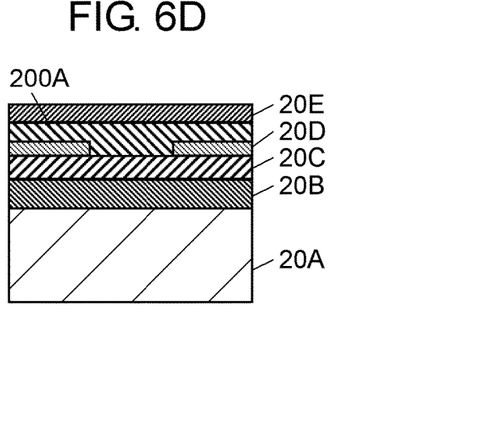
FIG. 6D is a cross-sectional view illustrating the method for fabricating the detection device subsequent to the process step illustrated in FIG. 6C.

Then, as illustrated in FIG. 6D, second insulating layer 20E is formed on the surface of first metal layer 200A. Second insulating layer 20E protects the surface of first metal layer 200A and insulates first metal layer 200A from electrodes and wires (not shown) formed on the surface of second insulating layer 20E. The electrodes and wires insulated from first metal layer 200A refer to electrodes such as Vdd, GND, Vout1, and Vout2, and resistors such as a resistor R1 corresponding to detection portion 14C, resistor R4 corresponding to detection portion 14D, resistors R2 and R3 disposed on frame 12, and wires connecting these electrodes and resistors to form a bridge circuit, illustrated in FIG. 4. In the case of forming a SiN film as second insulating layer 20E, chemical vapor deposition (CVD), for example, can be employed.

Figure 6E:
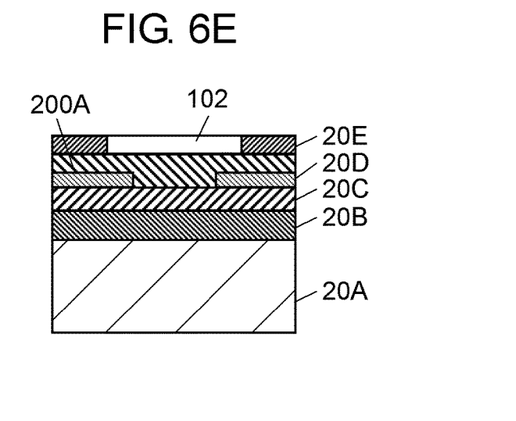
FIG. 6E is a cross-sectional view illustrating the method for fabricating the detection device subsequent to the process step illustrated in FIG. 6D.

Thereafter, as illustrated in FIG. 6E, second opening 102 is formed at a predetermined location in second insulating layer 20E. Second opening 102 can also be formed by the photolithography technique described above.

Figure 6F:
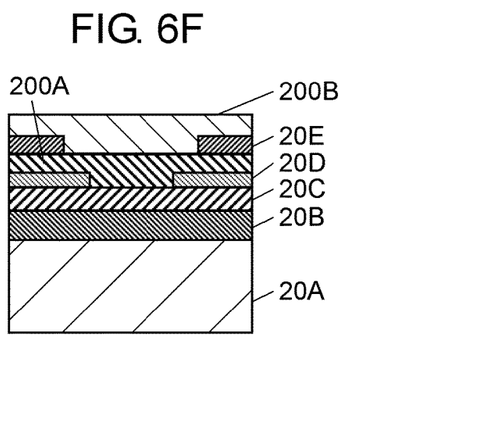
FIG. 6F is a cross-sectional view illustrating the method for fabricating the detection device subsequent to the process step illustrated in FIG. 6E.

Subsequently, as illustrated in FIG. 6F, second metal layer 200B is formed by, for example, a deposition technique such as spattering over the entire surface of second insulating layer 20E. Through the foregoing process steps, contact portion 11 can be formed.

Figure 7:
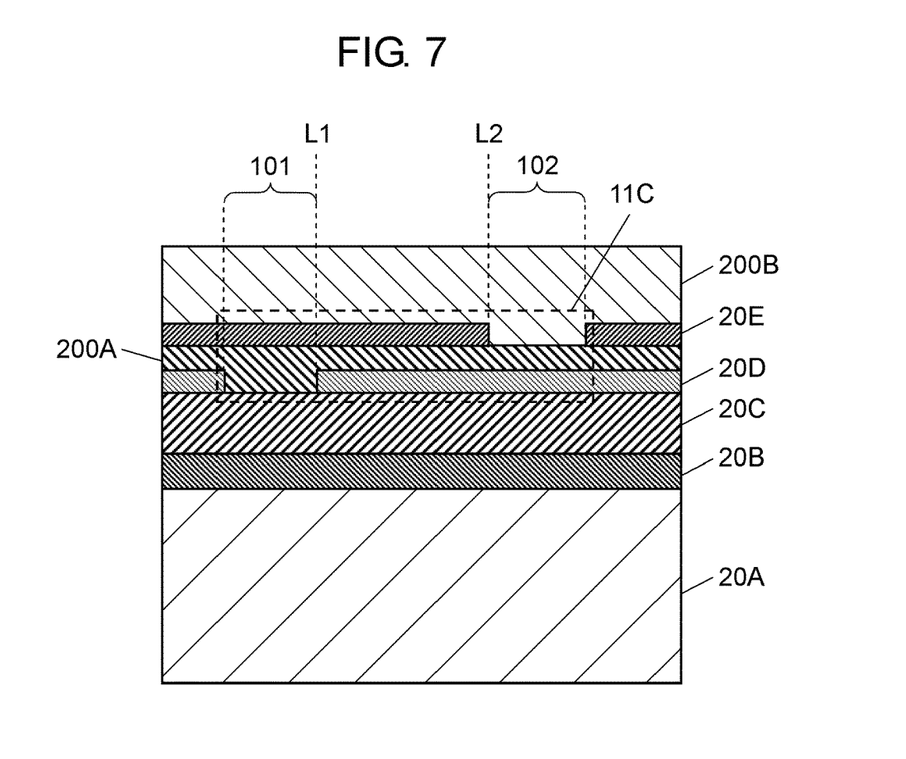
FIG. 7 is a cross-sectional view of another contact portion of the detection device of the acceleration sensor according to the first embodiment of the present disclosure.

As described above, in contact portion 11, first opening 101 in first insulating layer 20D and second opening 102 in second insulating layer 20E are located at the same location in a top view in different planes. However, as illustrated in FIG. 7, first opening 101 and second opening 102 may be located at different locations in a top view. FIG. 7 is a cross-sectional view of another contact portion 11C. Contact portion 11C includes first metal layer 200A, second insulating layer 20E, and second metal layer 200B. In this configuration, materials constituting first metal layer 200A and second insulating layer 20E are similar to those of contact portion 11, respectively.

In contact portion 11C, first opening 101 in first insulating layer 20D does not overlap second opening 102 in second insulating layer 20E when viewed in a plan view. That is, first opening 101 and second opening 102 are offset from each other. In other words, perpendicular line L1 passing at an edge of first opening 101 and perpendicular line L2 passing at an edge of second opening 102 are displaced from each other. In this configuration, in forming second opening 102 in second insulating layer 20E by etching, it is possible to prevent active layer 20C and second metal layer 200B from directly contacting each other through first metal layer 200A immediately above active layer 20C. Thus, it is possible to effectively suppress interdiffusion between silicon constituting active layer 20C and a metal constituting second metal layer 200B.

Figure 8:
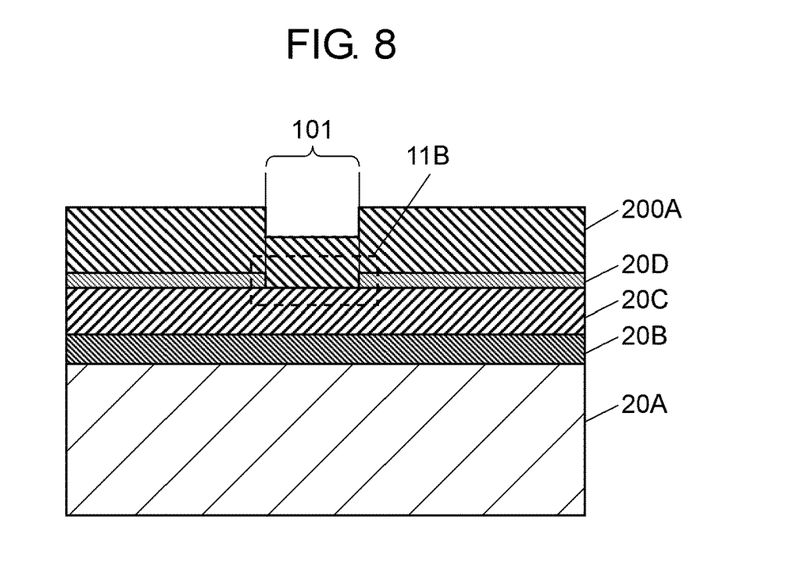
FIG. 8 is a cross-sectional view of yet another contact portion of the detection device of the acceleration sensor according to the first embodiment of the present disclosure.

In addition, as illustrated in FIG. 8, only first opening 101 and first metal layer 200A may be provided so that active layer 20C is connected to first metal layer 200A through first opening 101. FIG. 8 is a cross-sectional view schematically illustrating yet another contact portion 11B.

Contact portion 11B is formed by depositing first metal layer 200A of, for example, gold in first opening 101 formed in first insulating layer 20D. That is, contact portion 11B includes first metal layer 200A connected to active layer 20C through first opening 101. First metal layer 200A is disposed on a part of first insulating layer 20D at the side opposite to active layer 20C. First metal layer 200A is connected to ground electrode 18 provided on frame 12 by way of an unillustrated wire. That is, ground electrode 18 is electrically connected to active layer 20C of frame 12 through first metal layer 200A of contact portion 11B. Contact portion 11B having the configuration described above also has advantages similar to those of contact portion 11.

Figure 9:
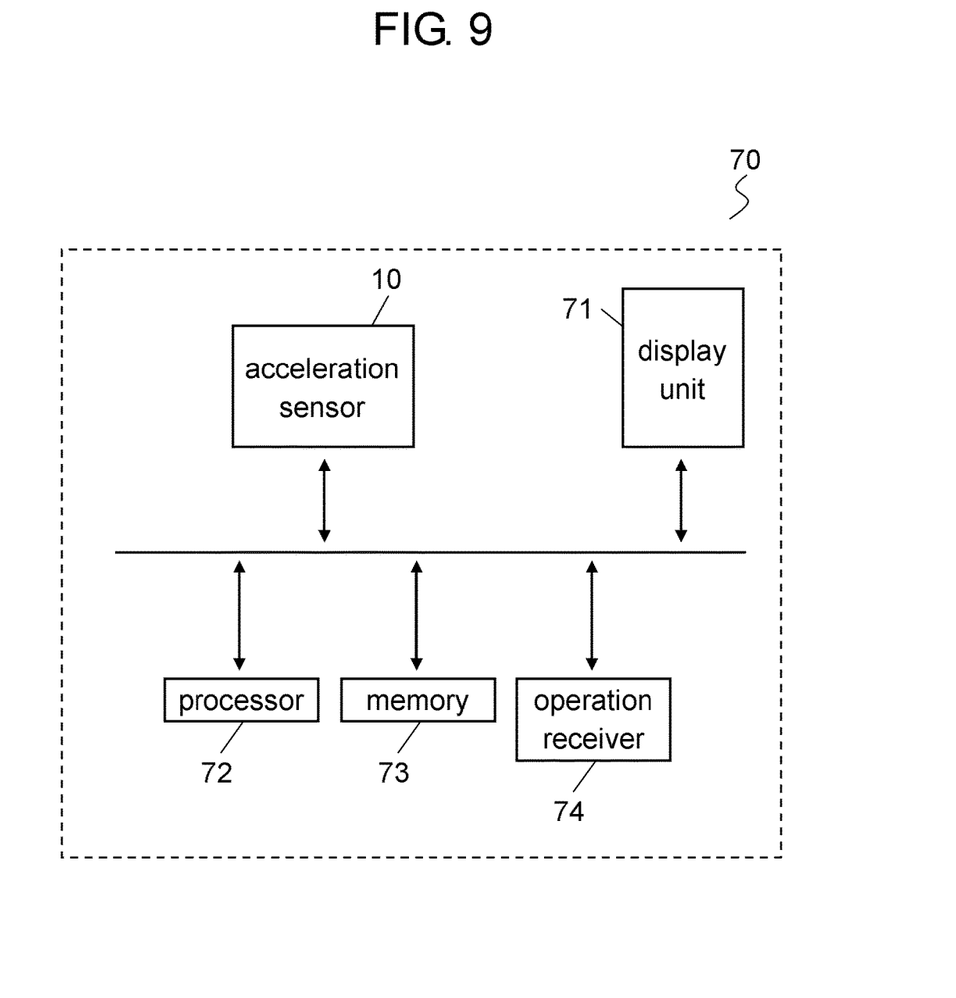
FIG. 9 is a block diagram of electronic equipment incorporating the acceleration sensor illustrated in FIG. 1.

Next, electronic equipment 70 incorporating acceleration sensor 10 will be described with reference to FIG. 9. FIG. 9 is a block diagram of a configuration example of electronic equipment 70 incorporating acceleration sensor 10. Electronic equipment 70 includes acceleration sensor 10, display unit 71, processor 72 such as a CPU, memory 73, and operation receiver 74. Electronic equipment 70 is, for example, a digital camera, a cellular phone, a smart phone, a car navigation system, a vehicle, an aircraft, or a robot.

As described above, acceleration sensor 10 can obtain stable self-check. Thus, reliability of electronic equipment 70 incorporating acceleration sensor 10 can be enhanced. In particular, acceleration sensor 10 can be effectively used for pose-detection.

Second Exemplary Embodiment

Figure 10:
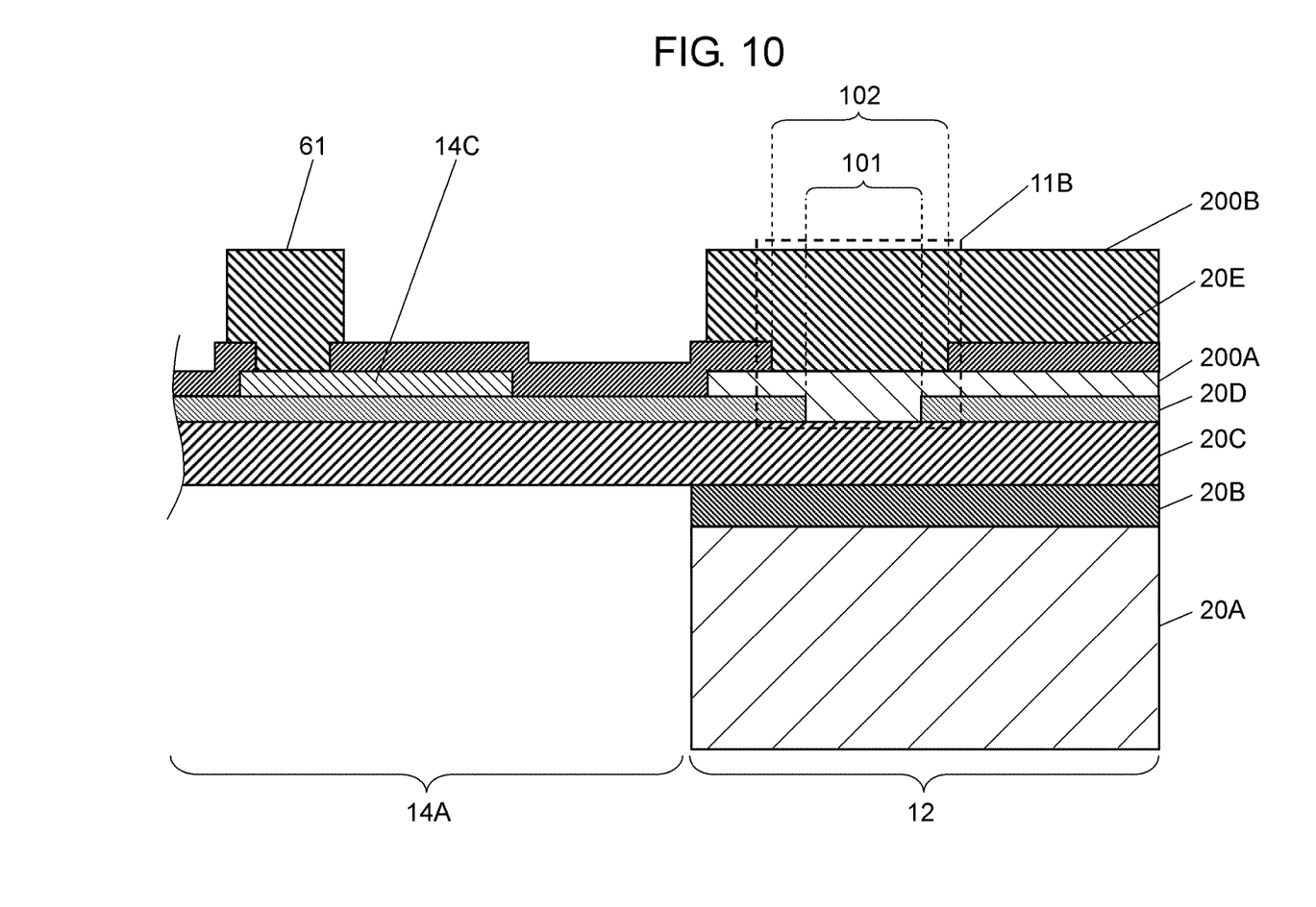
FIG. 10 is a cross-sectional view of a portion in vicinity of a contact portion of a detection device of an acceleration sensor according to a second embodiment of the present disclosure.
Figure 11:
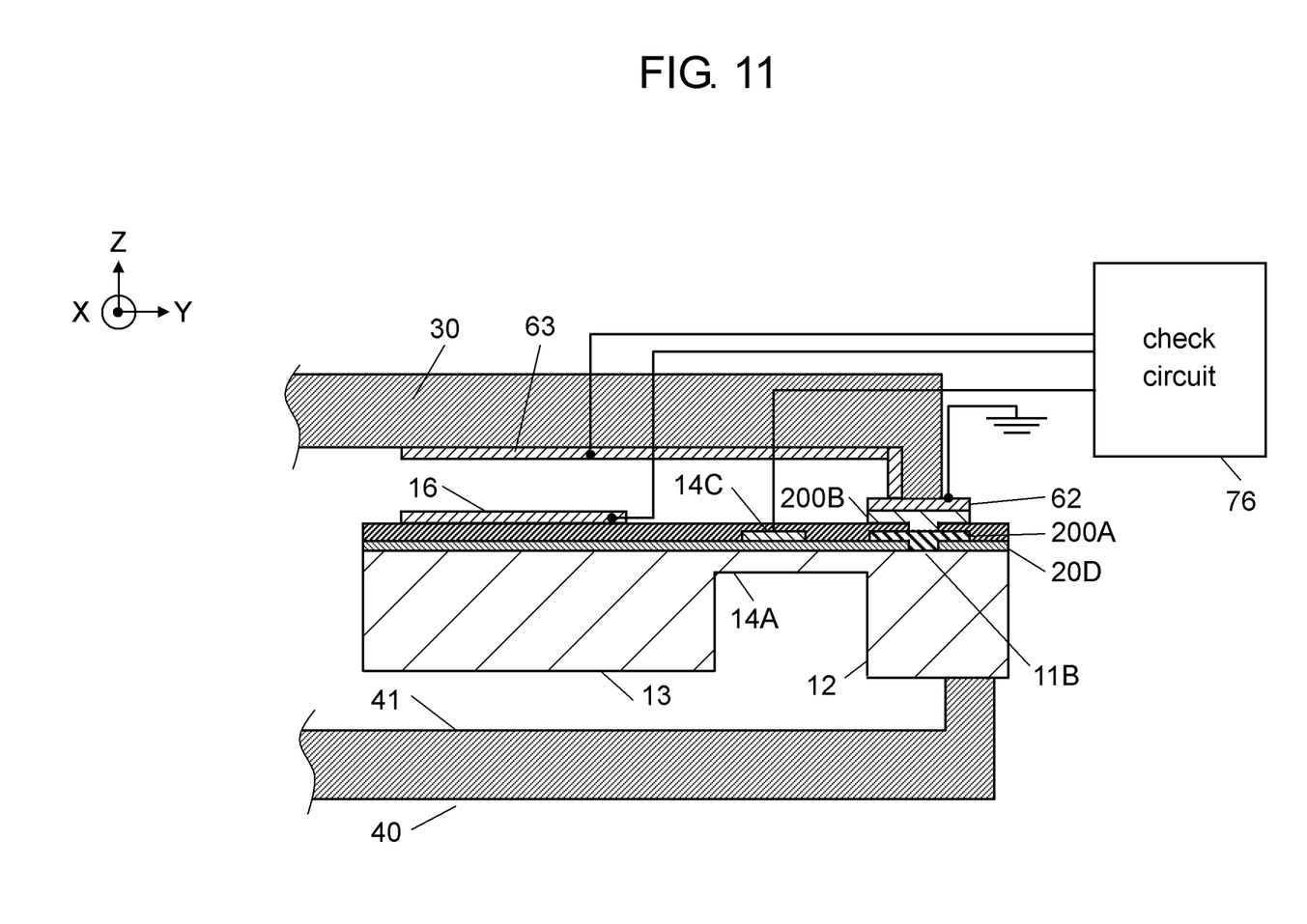
FIG. 11 is a partial cross-sectional view of the acceleration sensor according to the second embodiment of the present disclosure.

FIG. 10 is a side cross-sectional view of a portion in vicinity of a contact portion of an acceleration sensor according to a second embodiment of the present disclosure. FIG. 11 is a cross-sectional view of a detection device, a top lid, and a bottom lid in the acceleration sensor. In the following description, the same reference numerals as those shown in FIGS. 3A and 5 in the first embodiment are used to represent equivalent elements, and detailed description thereof will be omitted in some cases.

FIG. 10 is different from FIG. 5 in that first metal layer 200A in frame 12 and detection portion 14C in first beam 14A are provided on the same plane.

Such a configuration can be obtained by forming first metal layer 200A on the entire surface of first insulating layer 20D in the step described with reference to FIG. 6C. That is, at the same time when first metal layer 200A is formed, detection portion 14C and detection portion 14D can be formed on first beam 14A and second beam 14B, respectively. In other words, first metal layer 200A and detection portions 14C and 14D can be formed at the same time. Accordingly, the man-hour for forming the acceleration sensor can be reduced.

As illustrated in FIG. 10, interconnect layer 61 is formed on the upper surfaces of detection portion 14C and second insulating layer 20E. Interconnect layer 61 is electrically connected to detection portions 14C and 14D, and a pair of reference resistors (not shown), thereby constituting a bridge circuit.

Such a configuration can be obtained by forming second metal layer 200B on the entire surface of second insulating layer 20E in the process step described with reference to FIG. 6F. That is, at the same time when second metal layer 200B is formed, interconnect layer 61 can be formed on the upper surfaces of detection portions 14C and 14D. In other words, second metal layer 200B and interconnect layer 61 can be formed at the same time. Accordingly, the man-hour for forming the acceleration sensor can be reduced. Since second metal layer 200B and interconnect layer 61 are formed in the manner described above, interconnect layer 61 and second metal layer 200B are disposed on the same plane.

Meanwhile, FIG. 11 is different from FIG. 3A in that frame 12 and top lid 30 are connected to each other through bonding member 62 constituted by a bonding pad. Further, bonding member 62 electrically connects second metal layer 200B in contact portion 11 to opposed electrode 63 on top lid 30.

In acceleration sensor 10 according to the first embodiment, second metal layer 200B is connected to ground electrode 18 on frame 12 by way of an unillustrated wire. Thus, ground electrode 18 and a wiring pattern (not shown) connecting second metal layer 200B to ground electrode 18 enlarge frame 12.

On the other hand, in the acceleration sensor according to this embodiment, the configuration described above enables opposed electrode 63 grounded to GND for self-check to also serve as a ground electrode. Thus, ground electrode 18 and a wiring pattern (not shown) of ground electrode 18 do not need to be provided on frame 12. As a result, frame 12 and the acceleration sensor can be reduced in size.

In the electronic equipment illustrated in FIG. 9, acceleration sensor 10 may be replaced by the acceleration sensor according to the second embodiment.

An acceleration sensor according to the present disclosure enables stable self-check, and thus, is useful as an acceleration sensor for use in, for example, vehicles.

What is claimed is:
1. An acceleration sensor comprising:
a detection device including:
    an active layer;
    a base layer;
    an oxide layer disposed between the active layer and the base layer;
    a first insulating layer disposed on the active layer at a side opposite to the oxide layer and provided with a first opening;
    a contact portion disposed on a part of the first insulating layer at a side opposite to
    the active layer and including a first metal layer connected to the active layer through the first opening, and
    a self-check electrode disposed at a side of the first insulating layer opposite to the active layer and located away from the first metal layer;
an opposed electrode disposed at a location opposing the self-check electrode; and
a top lid supporting the opposed electrode,
wherein the detection device further includes a frame and a ground electrode disposed on the frame, and
the ground electrode is electrically connected to a part of the active layer in the frame through the contact portion.
2. The acceleration sensor according to claim 1,
wherein the frame includes a part of the first insulating layer, the part of the active layer, a part of the oxide layer, and a part of the base layer, and
wherein the detection device further includes:

a beam including a part of the first insulating layer and a part of the active layer, and having a first end and a second end which is connected to the frame;

a detection portion disposed on the beam and capable of detecting an acceleration applied to the acceleration sensor; and a weight part including a part of the first insulating layer, a part of the active layer, a part of the oxide layer, and a part of the base layer, and connected to the first end of the beam, the first opening is disposed in the first insulating layer in the frame, the self-check electrode is disposed on the first insulating layer in the weight part, and the top lid is connected to the frame.

3. The acceleration sensor according to claim 2, wherein the detection portion is a strain resistance.

4. The acceleration sensor according to claim 1, further comprising a check part that applies a voltage across the self-check electrode and the opposed electrode to perform self-check.

5. The acceleration sensor according to claim 1, wherein the contact portion further includes:

a second insulating layer disposed on the first metal layer at a side opposite to the first insulating layer and provided with a second opening; and a second metal layer disposed on a part of the second insulating layer at a side opposite to the first metal layer and connected to the first metal layer through the second opening.

6. The acceleration sensor according to claim 5, wherein the first metal layer is made of a material capable of preventing interdiffusion between a material included in the active layer and a material included in the second metal layer.

7. The acceleration sensor according to claim 5, wherein the first opening is entirely located within the second opening in a transparent plan view, and the first opening is smaller than the second opening.

* * * * *